(12) United States Patent
Tångring et al.

(10) Patent No.: US 12,062,741 B2
(45) Date of Patent: Aug. 13, 2024

(54) METHOD FOR PRODUCING A CONVERSION ELEMENT, CONVERSION ELEMENT, AND RADIATION-EMITTING COMPONENT

(71) Applicant: OSRAM Opto Semiconductors GmbH, Regensburg (DE)

(72) Inventors: Ivar Tångring, Regensburg (DE); Nusret Sena Güldal, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 567 days.

(21) Appl. No.: 17/292,406

(22) PCT Filed: Nov. 11, 2019

(86) PCT No.: PCT/EP2019/080867
§ 371 (c)(1),
(2) Date: May 7, 2021

(87) PCT Pub. No.: WO2020/099319
PCT Pub. Date: May 22, 2020

(65) Prior Publication Data
US 2022/0013697 A1 Jan. 13, 2022

(30) Foreign Application Priority Data
Nov. 15, 2018 (DE) ............... 10 2018 128 753.4

(51) Int. Cl.
*H01L 33/50* (2010.01)
(52) U.S. Cl.
CPC .... *H01L 33/508* (2013.01); *H01L 2933/0041* (2013.01); *H01L 2933/0091* (2013.01)

(58) Field of Classification Search
CPC . H01L 33/508; H01L 33/0025; H01L 33/502; H01L 33/44; H01L 2933/0041;
(Continued)

(56) References Cited

U.S. PATENT DOCUMENTS

2009/0039375 A1  2/2009  Letoquin et al.
2013/0320384 A1* 12/2013  Liepold ............. F21V 9/00
                                                   156/89.12
2021/0270428 A1*  9/2021  Ueda ............... G03B 21/204

FOREIGN PATENT DOCUMENTS

DE  102011113962 A1  3/2013
DE  102012110668 A1  5/2014
(Continued)

OTHER PUBLICATIONS

Office Action in JP2021526636, mailed May 9, 2022, 2 pages.
International Search Report for PCT/EP2019/080867 mailed Jan. 29, 2020.

*Primary Examiner* — Sitaramarao S Yechuri
(74) *Attorney, Agent, or Firm* — ArentFox Schiff LLP

(57) ABSTRACT

A method for producing a conversion element comprising the following steps is described: providing a conversion layer having a matrix, in which phosphor particles are brought in, the phosphor particles comprising a host lattice having activator ions and being concentrated in a enrichment zone, providing a compensation layer having the matrix, in which compensation particles are brought in, which comprise the host lattice and are concentrated in a enrichment zone, and joining the conversion layer and the compensation layer in such a way that the enrichment zone of the conversion layer and the enrichment zone of the compensation layer are arranged symmetrically to one another with respect to a symmetry plane of the conversion element. A conversion element and a component are also specified.

10 Claims, 4 Drawing Sheets

Figure 1:
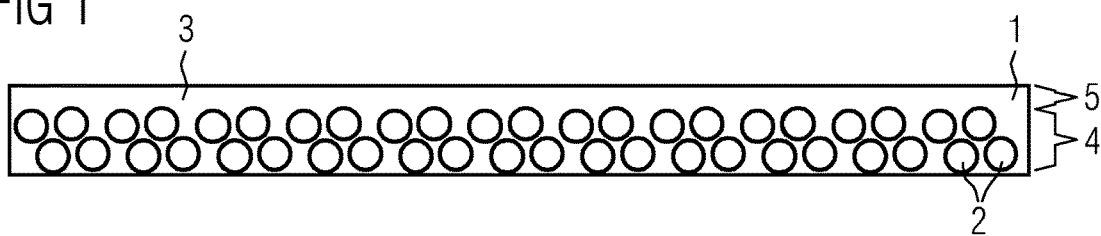

(58) Field of Classification Search
CPC ............ H01L 2933/0091; H10K 59/38; H10K 2102/331
See application file for complete search history.

(56) References Cited

FOREIGN PATENT DOCUMENTS

| | | |
|---|---|---|
| JP | 2016066764 A | 4/2016 |
| JP | 2018021155 A | 2/2018 |
| WO | 2014/023617 A1 | 2/2014 |
| WO | 2015/091388 A1 | 6/2015 |

\* cited by examiner

METHOD FOR PRODUCING A CONVERSION ELEMENT, CONVERSION ELEMENT, AND RADIATION-EMITTING COMPONENT

This application is a 35 U.S.C.§ 371 National Phase of PCT Application No. PCT/EP2019/080867, filed Nov. 11, 2019, which claims priority to German Application No. 10 2018 128 753.4, filed Nov. 15, 2018, the disclosures of which are hereby incorporated by reference herein in their entireties.

A method for producing a conversion element, a conversion element, and a radiation-emitting component are specified.

A conversion element having a matrix and comprising a low bending is to be specified. Also, a method for producing such a conversion element is to be specified. Further, an improved radiation-emitting component is to be specified.

These tasks are solved by a method comprising the steps of claim 1, by a conversion element comprising the features of claim 7, and by a radiation-emitting component comprising the features of claim 10.

Advantageous embodiments of the method, the conversion element and the radiation-emitting component are specified in the respective dependent claims.

According to one embodiment of the method for producing a conversion element, a conversion layer is provided. The conversion layer preferably comprises a matrix in which phosphor particles are brought in. The phosphor particles convert electromagnetic radiation of a first wavelength range into electromagnetic radiation of a second wavelength range. The first wavelength range is preferably different from the second wavelength range.

In other words, the phosphor particles are designed converting. By the term "converting" it is presently meant that irradiated electromagnetic radiation of a certain wavelength range is converted into electromagnetic radiation of another, preferably longer-wave wavelength range. As a rule, a converting element absorbs electromagnetic radiation of an irradiated wavelength range, converts it by electronic processes on the atomic and/or molecular level into electromagnetic radiation of another wavelength range and re-emits the converted electromagnetic radiation. In particular, pure scattering or pure absorption is presently not understood as converting.

The phosphor particles preferably comprise a host lattice doped with activator ions. The host lattice is preferably ceramic and/or crystalline. The activator ions preferably impart the converting properties to the phosphor particles.

The host lattice alters the electronic structure of the activator in such a way that electromagnetic radiation of the first wavelength range is absorbed and excites an electronic transition in the phosphor particles, which returns to the ground state while emitting electromagnetic radiation of the second wavelength range.

According to one embodiment, the phosphor particles comprise a diameter between 1 micrometer and 30 micrometers, inclusive, preferably between 5 micrometers and 25 micrometers, inclusive.

For example, one of the following materials is suitable for the phosphor particles: rare earth doped garnets, rare earth doped nitrides, rare earth doped SiAlONs.

According to one embodiment, the conversion layer comprises an enrichment zone at a first main surface where the phosphor particles are enriched. In other words, the phosphor particles comprise a higher concentration in the enrichment zone than at a second main surface of the conversion layer opposite to the first main surface.

According to another embodiment of the method, a compensation layer is provided. The compensation layer comprises the matrix in which compensation particles are brought in. The compensation particles are preferably formed from the same host lattice as the phosphor particles comprise. However, the compensation particles preferably do not comprise activator ions. In particular, the compensation particles are preferably non-converting. Preferably, the compensation particles are transmissive of electromagnetic radiation of the first wavelength range. Preferably, the compensation particles transmit at least 80%, particularly preferably at least 90% of the electromagnetic radiation of the first wavelength range. Preferably, the compensation particles comprise the same mechanical properties as the phosphor particles. Preferably, the compensation particles are designed the same as the phosphor particles except for the activator ions and the resulting converting properties. Preferably, the compensation particles are enriched in an enrichment zone at a first main surface of the compensation layer.

Preferably, the phosphor particles and/or the compensation particles comprise a concentration in the enrichment zone that is at least 20% by volume, more preferably at least 50% by volume. For example, the enrichment zone comprises a thickness between 10 micrometers and 60 micrometers, inclusive.

According to a further embodiment of the method, the conversion layer and the compensation layer are bonded to each other, preferably in a material-to-material bond. Here, the conversion layer and the compensation layer can be in direct contact with each other. Preferably, the connection of the conversion layer and the compensation layer is free of a joining layer.

Preferably, the conversion layer and the compensation layer are arranged such that the enrichment zone of the conversion layer and the enrichment zone of the compensation layer are arranged symmetrically with respect to each other with respect to a symmetry plane of the conversion element. In this case, the symmetry plane of the conversion element preferably runs parallel to a main extension plane of the conversion element.

According to a further embodiment of the method, a second main surface of the conversion layer facing the first main surface of the conversion layer and a second main surface of the compensation layer facing the first main surface of the compensation layer are arranged between the first main surface of the conversion layer and the first main surface of the compensation layer.

Preferably, the matrix is transmissive for electromagnetic radiation of the first wavelength range and/or the second wavelength range. Preferably, the matrix transmits at least 80%, more preferably at least 90% of the electromagnetic radiation of the first and/or the second wavelength range.

For example, the matrix may comprise or consist of an inorganic material.

Preferably, the inorganic matrix is formed of glass or comprises a glass. Further, it is also possible for the matrix to comprise or consist of an organic material. Preferably, the organic matrix is formed of or comprises a polysiloxane.

According to another embodiment of the method providing the conversion layer comprises the steps described below. First, a liquid conversion material is provided comprising the matrix in liquid form and the phosphor particles. The liquid conversion material may further comprise a solvent, such as water or ethanol. A layer is formed from the liquid conversion material, typically on a carrier, such as by printing, using doctor blades, or film drawing.

Then, the phosphor particles are sedimented in the matrix in liquid form so that phosphor particles enrich in the enrichment zone at a first main surface of the layer.

During sedimentation, the liquid matrix containing the phosphor particles is deposited on a carrier. Subsequently, the phosphor particles settle on the carrier in the form of a layer due to gravity. The settling of the phosphor particles can also be accelerated by centrifugation. The use of a diluted matrix material also usually accelerates the sedimentation process.

In a next step, the matrix of the layer of liquid conversion material is pre-cured and/or cured, for example by drying, so as to form the conversion layer having the first main surface on which the phosphor particles are enriched in the enrichment zone. Further, the conversion layer comprises a depletion zone, which is generally free of phosphor particles and arranged at the second main surface of the conversion layer.

According to one embodiment of the method, providing the compensation layer comprises the steps described in the following. First, a liquid compensation material is again provided comprising the matrix in liquid form and the compensation particles. The liquid compensation material may further comprise a solvent, such as water or ethanol Then a layer is formed from the liquid compensation material, for example by printing or film drawing. In a next step, the compensation particles are sedimented in the liquid matrix so that compensation particles enrich at a first main surface of the layer of the liquid compensation material in an enrichment zone. Then, the matrix is pre-cured and/or cured to form a compensation layer having the first main surface on which the compensation particles are enriched in the enrichment zone. In addition, the compensation layer comprises a depletion zone generally free of compensation particles and arranged at the second main surface of the compensation layer.

To pre-cure the inorganic matrix, a drying step can first be carried out, resulting in a mechanically stable compensation layer or conversion layer. If the matrix is an inorganic matrix, for example made of glass, the inorganic matrix can be sintered at significantly higher temperatures after pre-curing in order to achieve further mechanical stabilization of the compensation layer and/or the conversion layer. For example, temperatures between 500° C. and 1000° C. inclusive are suitable for sintering a glass matrix. During sintering, the layers of the conversion element can be bonded to each other in a materially and mechanically stable manner.

If the matrix is an organic matrix, it can be pre-cured, for example, by partial crosslinking or drying and cured by complete crosslinking. For example, temperatures between 150° C. and 200° C. inclusive can be used for full curing. During full curing, the layers of the conversion element can be bonded to each other in a materially and mechanically stable manner.

According to a further embodiment, a scattering layer is arranged between the conversion layer and the compensation layer. The scattering layer scatters electromagnetic radiation of the first and/or the second wavelength range. Preferably, the scattering layer is free of converting properties. Preferably, the scattering layer comprises the matrix. Preferably, scattering particles are brought into the matrix. For example, the scattering particles comprise or consist of one of the following materials: $Al_2O_3$, $ZrO_2$, $TiO_2$. The scattering layer advantageously leads to a better mixing of converted and unconverted light passing through the conversion element. Furthermore, it is possible to adjust the radiation characteristic of the conversion element in a desired way with the help of the scattering layer.

Preferably, the scattering particles comprise a diameter that is at most 1000 nanometers, particularly preferably at most 500 micrometers. Preferably, the scattering particles comprise a diameter of at least 50 nanometers. Preferably, the scattering particles are so small that only such a small amount of sedimentation occurs during the generation of the scattering layer that no significant enrichment zone is formed on one of the main surfaces of the subsequent scattering layer.

Furthermore, it is also possible that a transmitting layer is arranged between the conversion layer and the compensation layer. The transmitting layer preferably transmits at least 80%, particularly preferably at least 90%, of the electromagnetic radiation of the first and/or the second wavelength range. Here, the transmitting layer is preferably free of particles such as scattering particles, compensation particles or phosphor particles. The transmitting layer preferably comprises the matrix or is preferably formed from the matrix. Advantageously, the transmitting layer can be used to make the conversion element thicker so that it can be more easily handled.

A conversion element can be formed using the method described herein. Features and embodiments described herein in connection with the method may also be formed in the conversion element, and vice versa.

According to a particularly preferred embodiment, a conversion element comprises a conversion layer with a matrix in which phosphor particles are brought in. The phosphor particles convert electromagnetic radiation of a first wavelength range into electromagnetic radiation of a second wavelength range. In this case, the phosphor particles preferably comprise a host lattice with activator ions. The host lattice is preferably ceramic and/or crystalline. Furthermore, the phosphor particles are preferably enriched in an enrichment zone at a first main surface of the conversion layer. In this preferred embodiment, the conversion element comprises a compensation layer with the matrix in which compensation particles are brought in. The compensation particles preferentially transmit electromagnetic radiation of the first wavelength range and comprise the host lattice. Furthermore, the compensation particles are preferably enriched in an enrichment zone at a first main surface of the compensation layer. Finally, the enrichment zone of the conversion layer and the enrichment zone of the compensation layer are preferably arranged symmetrically with respect to each other with respect to a symmetry plane of the conversion element. Preferably, the enrichment zones each face the outer surfaces of the conversion element.

Preferably, the compensation layer compensates a stress of the conversion layer, particularly preferably completely. According to a preferred embodiment of the conversion element, the compensation layer compensates for the stress of the conversion layer such that the conversion element is free from a concave or convex bending along a main extension plane of the conversion element. Preferably, the bending of the conversion element is not greater than 5 micrometers, more preferably not greater than 1 micrometer.

Preferably, the conversion layer and/or the compensation layer comprises a thickness between 20 micrometers and 100 micrometers, inclusive.

According to a preferred embodiment, the concentration of the phosphor particles and the concentration of the compensation particles in the matrix are respectively equal. Particularly preferably, the phosphor particles and the compensation particles comprise the same size distribution. For example, the phosphor particles and/or the compensation particles comprise a value of the median $d_{50}$ between 5 micrometers and 30 micrometers inclusive, preferably between 10 micrometers and 20 micrometers inclusive.

According to a further embodiment of the conversion element, the conversion element comprises a plurality of compensation layers. Each compensation layer here comprises an enrichment zone of compensation particles as described above. The enrichment zones of the compensation layers of all layers of the conversion element are here arranged symmetrically with respect to each other with respect to the symmetry plane of the conversion element. Even with a plurality of compensation layers, conversion elements can be produced that comprise a greater thickness and are thus mechanically easier to handle.

According to one embodiment, the conversion element comprises at least one further conversion layer. Here, the further conversion layer particularly preferably comprises different phosphor particles than the conversion layer already described, so that the further conversion layer has different converting properties than the conversion layer already described. For example, the conversion element comprises a conversion layer whose phosphor particles convert blue light into red light, while a further conversion layer converts blue light into yellow light and/or into green light.

Preferably, the conversion element comprises a further compensation layer with an enrichment zone for each further conversion layer. In this case, the further compensation layer comprises compensation particles which are formed from a host lattice or comprise a host lattice which is identical to the host lattice of the phosphor particles of the conversion layer which is compensated by the respective compensation layer. Particularly preferably, the enrichment zones of the further conversion layers and the enrichment zones of the further compensation layers are arranged symmetrically with respect to each other with respect to the symmetry plane of the conversion element.

The conversion element preferably comprises a thickness of at least 40 micrometers, particularly preferably of at least 100 micrometers.

The total number of compensation layers and conversion layers of the conversion element is particularly preferably even.

The conversion element described herein is suitable for use in a radiation emitting device. All embodiments, features and further embodiments of the conversion element may also be formed in the radiation-emitting component and vice versa.

According to a preferred embodiment, the component comprises a radiation-emitting semiconductor chip. In operation, the radiation-emitting semiconductor chip emits electromagnetic radiation of a first wavelength range from a radiation exit surface. Particularly preferably, the semiconductor chip emits blue light and/or ultraviolet light.

Due to its low bending, the conversion element can be particularly well fixed in a mechanically stable manner on the radiation exit surface of the semiconductor chip by means of a particularly thin and homogeneous adhesive layer. Thus, components with a higher performance and a longer lifetime can be obtained.

According to a further embodiment, a conversion element already described is comprised by the component. The conversion element particularly preferably converts electromagnetic radiation of the first wavelength range at least partially into electromagnetic radiation of a second wavelength range. For example, the conversion element converts blue and/or ultraviolet radiation into yellow light and/or green light and/or red light. The conversion element is particularly preferably applied to the radiation exit surface of the semiconductor chip, for example by means of a joining layer.

The method described herein is based in particular on the idea described in the following. In particular, when a glass matrix is used, the phosphor particles usually sediment during the producing of the conversion layer as long as the glass matrix is in a liquid state. In this process, an enrichment zone is usually formed on the first main surface of the conversion layer. When the conversion layer with the enrichment zone is arranged on the radiation emitting surface of the radiation emitting semiconductor chip, heat can be effectively dissipated from the conversion element.

However, the enrichment zone changes the center of gravity of the conversion layer. In addition, the enrichment zone and the depletion zone comprise different thermal expansion coefficients. This leads to mechanical stresses and bending within the final sintered, cooled conversion layer, so that the conversion layer can only be poorly applied to a semiconductor chip. Therefore, a compensation layer with an enrichment zone is provided presently in the conversion element, which comprises mechanical and thermal properties as similar as possible to the enrichment zone of the conversion layer.

For this purpose, compensation particles are used that comprise mechanical properties as similar as possible to those of the phosphor particles, but are not converting. The compensation particles are preferably formed from the host lattice of the phosphor particles, which is, however, free of activator ions. To compensate for the bending of the conversion layer, the compensation layer and the conversion layer are preferably arranged with respect to each other such that the enrichment zones are positioned symmetrically with respect to a symmetry plane of the conversion element.

Further advantageous embodiments and further embodiments of the invention are apparent from the exemplary embodiments described in the following in connection with the figures.

The schematic sectional views in FIGS. 1 to 3, FIGS. 5 to 6 and FIGS. 9 to 12 show a method according to an exemplary embodiment each.

The schematic sectional views of FIGS. 4, 7, 8, and 13 show a conversion element according to an exemplary embodiment each.

Figure 14:
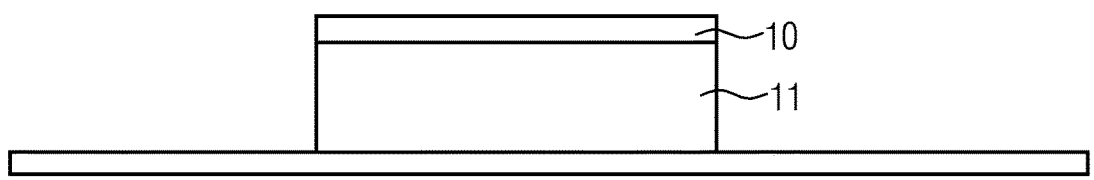

FIG. 14 shows a schematic sectional view of a radiation emitting device according to an exemplary embodiment.

Elements that are identical, of the same kind or have the same effect are given the same reference signs in the figures. The figures and the proportions of the elements shown in the figures with respect to one another are not to be regarded as to scale. Rather, individual elements, in particular layer thicknesses, may be shown exaggeratedly large.

Figure 2:
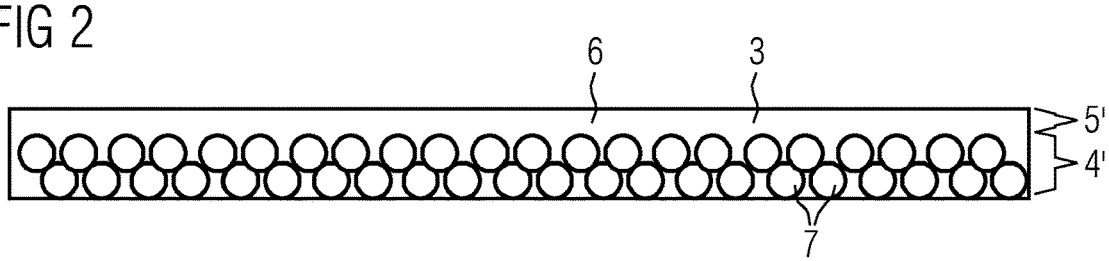
Figure 3:
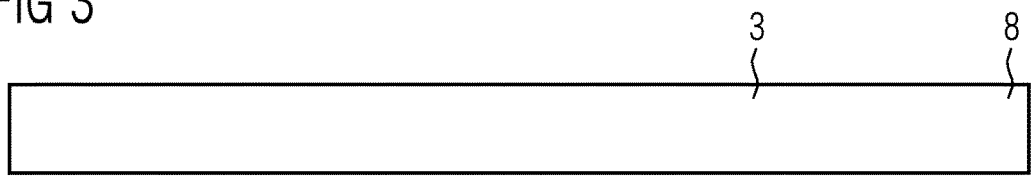

In the exemplary embodiment according to the method of FIGS. 1 to 3, a conversion layer 1 is first provided (FIG. 1). To produce the conversion layer 1, in a first step phosphor particles 2, which convert blue light into yellow and/or green light, are brought into a matrix 3, for example a glass matrix. Here, the matrix 3 is in liquid form. The phosphor particles 2 may comprise a garnet phosphor, for example with the formula $Lu_3(Al,Ga)_5O_{12}:Ce^{3+}$, or a α-SiAlON. The liquid matrix 3 containing the phosphor particles 2 is applied to a carrier and the phosphor particles 2 are sedimented in the liquid matrix (not shown). After sedimentation, the matrix 3 is dried to form a conversion layer 1.

Due to the sedimentation process, the phosphor particles 2 enrich in an enrichment zone 4 at a first main surface of the conversion layer 1. Furthermore, the conversion layer 1 comprises a depletion zone 5 facing a second main surface of the conversion layer 1, which is opposite to the first main surface of the conversion layer 1.

The phosphor particles 2 comprise a host lattice in which activator ions are brought in to impart the converting properties to the phosphor particles 2. In the case of phosphor particles 2 of the formula $Lu_3(Al,Ga)_5O_{12}:Ce^{3+}$, the formula $Lu_3(Al,Ga)_5O_{12}$ specifies the material of the host lattice and $Ce^{3+}$ specifies the activator ions.

In a next step, a compensation layer 6 is provided (FIG. 2). To produce the compensation layer 6, the same steps are carried out as for producing the conversion layer 1. However, instead of the phosphor particles 2, which comprise a host lattice with activator ions, compensation particles 7 are used, which comprise the same host lattice as the phosphor particles 2 but are free of activator ions.

The compensation particles 7 of the compensation layer 6 transmit electromagnetic radiation of the first wavelength range. Also, the compensation particles 6 are enriched in an enrichment zone 4' at a first main surface of the compensation layer 6. Furthermore, the compensation layer 6 comprises a depletion zone 5' arranged at a second main surface of the compensation layer and at least partially free of compensation particles 7.

In a next step, a scattering layer 8 is generated (FIG. 3). The scattering layer 8 comprises the matrix in which scattering particles are brought in.

Then, the conversion layer 1 and the compensation layer 6 are combined to form a conversion element 10 in such a way that the enrichment zone 4 of the conversion layer 1 and the enrichment zone 4' of the compensation layer 7 are arranged symmetrically with respect to each other with respect to a symmetry plane 9 of the conversion element 10. In this case, the symmetry plane 9 runs parallel to a main extension plane of the conversion element 10. The scattering layer 8 is positioned between the compensation layer 6 and the conversion layer 1. The compensation layer 6, the conversion layer 1 and the scattering layer 8 can be bonded material-to-material to each other by sintering, for example. Alternatively to the scattering layer 8, a transmitting layer can also be used in the conversion element 10.

Figure 4:
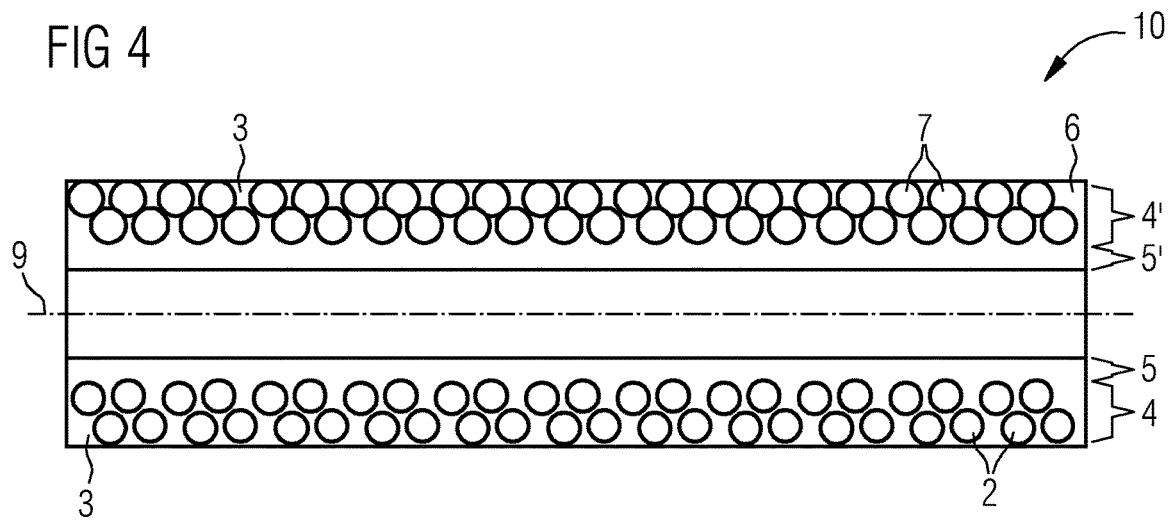

The conversion element 10 according to FIG. 4 can be produced, for example, using the method according to FIGS. 1 to 3. The conversion element 10 according to FIG. 4 comprises a conversion layer 1 which converts blue light into green-yellow light. Phosphor particles made of a garnet phosphor are suitable for this purpose, for example. The conversion element 10 can be designed in such a way that primary blue radiation partially passes through the conversion element 10 and mixes with converted green-yellow radiation to form cool white light. In this embodiment, the scattering particles preferably comprise $Al_2O_3$ and a diameter of approximately 500 nanometers. Such scattering particles scatter light of the first and/or second wavelength range due to the refractive index difference to the matrix and homogenize the radiation pattern with advantage.

The conversion element 10 according to FIG. 4 can alternatively be designed to convert blue light of a semiconductor chip 11 as completely as possible into green-yellow light. The scattering layer 8 here preferably comprises scattering particles with a diameter between 50 nanometers and 500 nanometers inclusive made of one of the following materials: $Al_2O_3$, $ZrO_2$, $TiO_2$. The scattering layer 8 can advantageously contribute to the most complete conversion of irradiated blue light by the conversion element 10 by backscattering unconverted light into the conversion layer 1 due to Rayleigh scattering.

Figure 5:
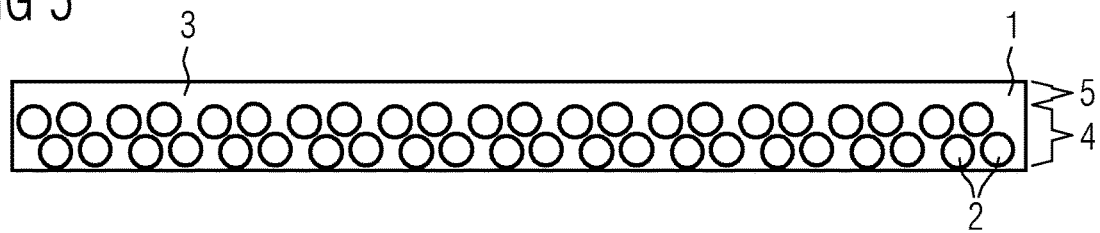
Figure 6:
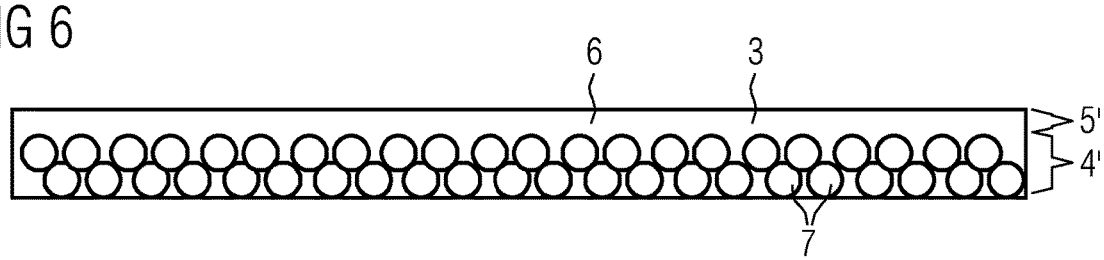

In the method according to the exemplary embodiment of FIGS. 5 to 6, in contrast to the method of FIGS. 1 to 3, the compensation layer 6 is generated three times and bonded to the provided conversion layer 1 to form a conversion element 10, for example by sintering.

Figure 7:
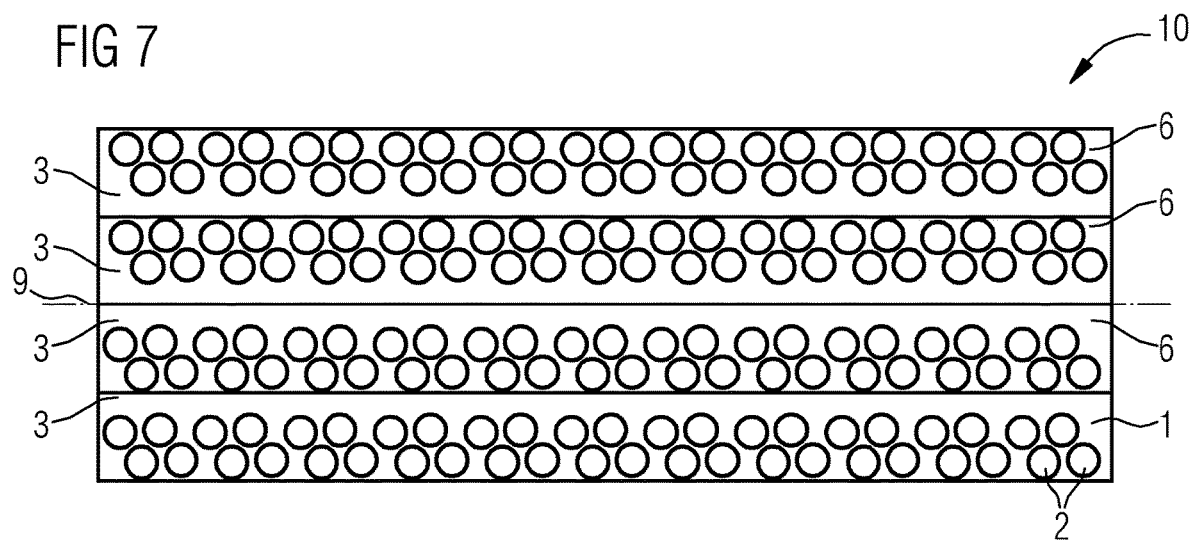
Figure 8:
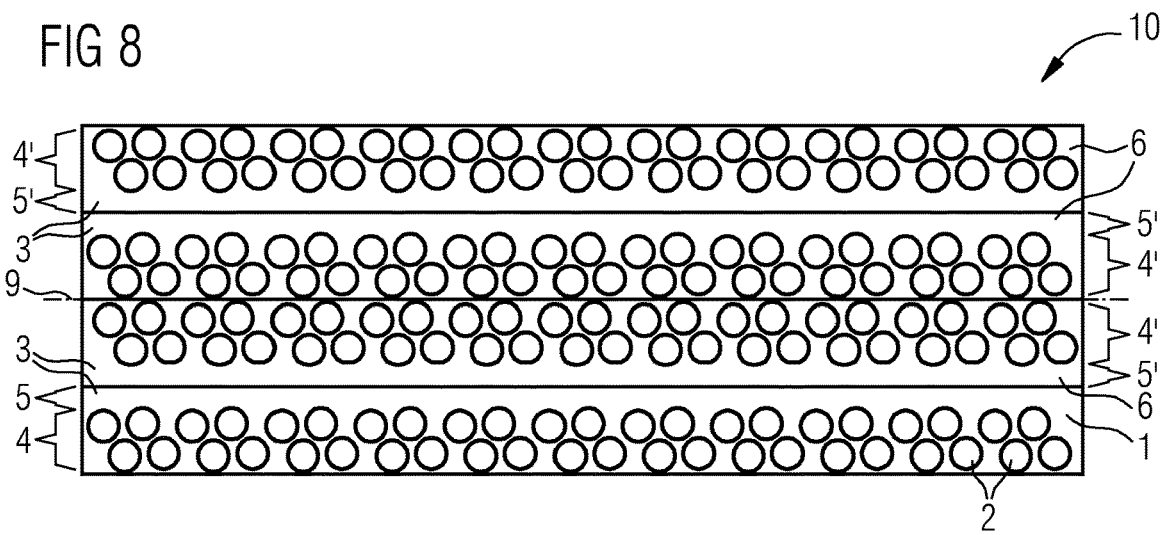
Figure 9:
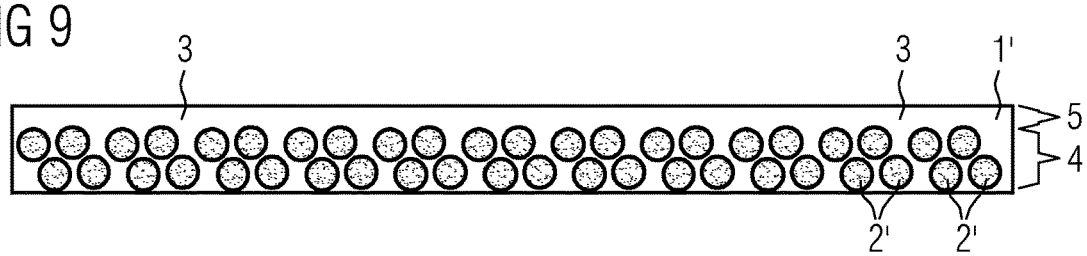

The conversion elements 10 according to the exemplary embodiments of FIGS. 7 and 8 can each be generated using the method according to FIGS. 5 to 6. In contrast to the conversion element 10 of FIG. 4, the conversion element 10 according to FIG. 8 comprises three compensation layers 6. The enrichment zones 4, 4' of the compensation layers 6 and of the conversion layer 1 are arranged symmetrically to a symmetry plane 9 of the conversion element 10. The enrichment zones 4, 4' of the compensation layers 6 and of the conversion layer 1 each face an outer surface of the conversion element 10.

In contrast to this, two inner compensation layers 6 of the conversion element 10 according to the exemplary embodiment of FIG. 8, which are arranged between an outer compensation layer 6 and a conversion layer 1, point to a symmetry plane 9 of the conversion element 10.

In the method according to the exemplary embodiment of FIGS. 9 to 12, a conversion layer 1 is first generated (FIG. 10), as already described with reference to FIG. 1. A compensation layer 6 is produced to match the conversion layer 1 (FIG. 11), as already described with reference to FIG. 2.

Figure 10:
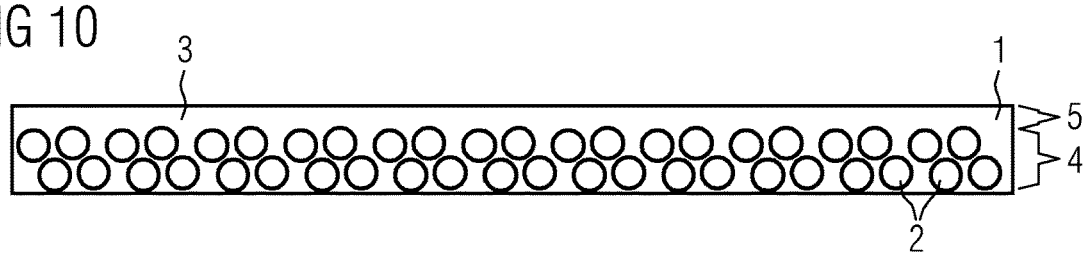
Figure 11:
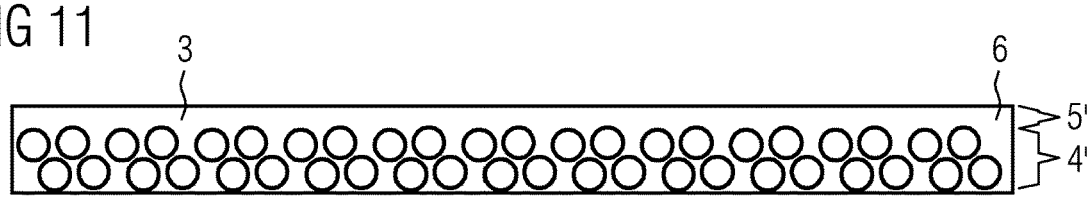
Figure 12:
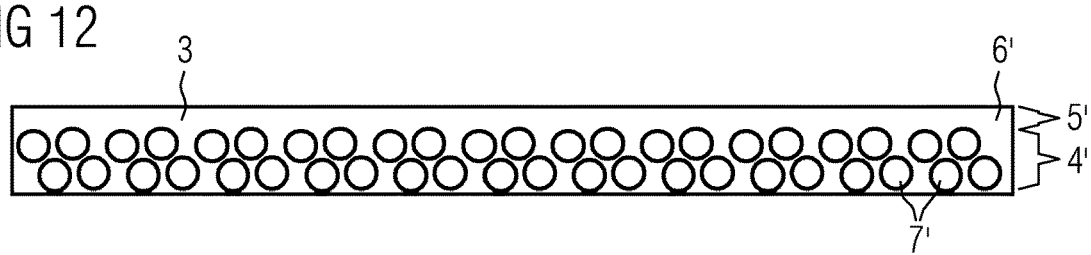

In addition, a further conversion layer 1' is generated (FIG. 9), which, in contrast to conversion layer 1 according to FIG. 10, comprises phosphor particles 2' that convert blue light into red light. The phosphor particles 2' comprise, for example, $CaAlSiN:Eu^{2+}$ or are formed from $CaAlSiN:Eu^{2+}$. Matching the further conversion layer 1, a further compensation layer 6' is generated (FIG. 12), which comprises compensation particles 7' formed only from the host lattice CaAlSiN without activator ions $Eu^{2+}$.

Figure 13:
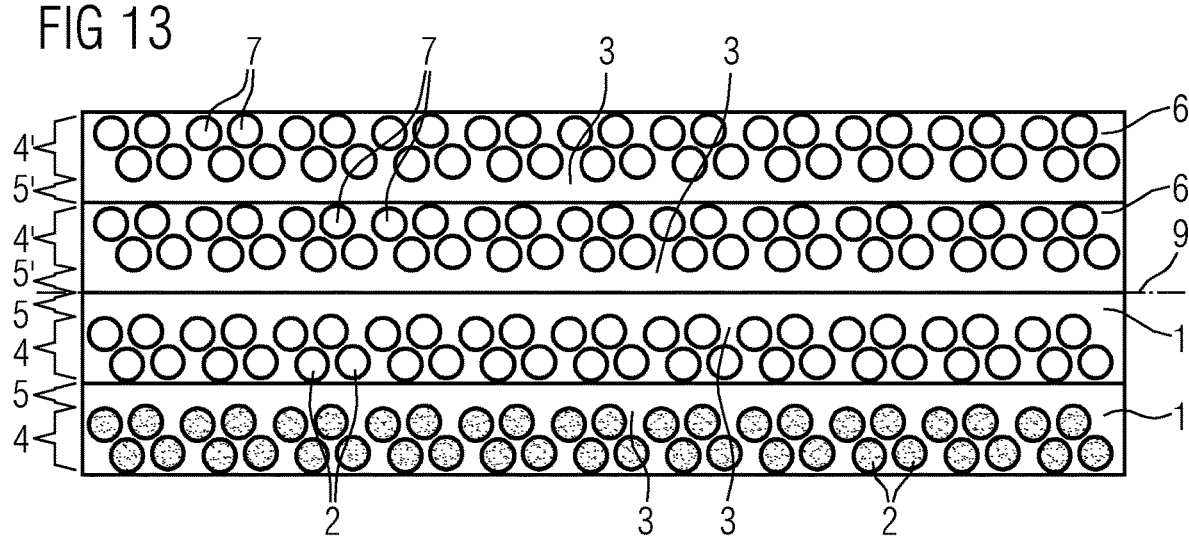

In a next step, the compensation layers 6, 6' and conversion layers 1, 1' are joined to form a conversion element 10, for example by sintering (FIG. 13). The enrichment zones 4 of the conversion layers 1, 1' and the enrichment zones 4' of the compensation layers 6, 6' are arranged symmetrically with respect to each other with respect to a symmetry plane 9 of the conversion element 10.

The conversion element 10 according to FIG. 13 is designed to convert irradiated blue light, for example from a semiconductor chip 11, partially into yellow-green light and partially into red light, while blue light is partially transmitted by the conversion element 10. In this way, the conversion element 10 can be used to generate white or warm white light from blue radiation from a semiconductor chip 11. By using further conversion layers 1 in the conversion element 10, it is possible to adjust a color rendering index and a correlated color temperature of the white light in a desired manner.

The optoelectronic component according to the exemplary embodiment of FIG. 14 comprises a radiation emitting semiconductor chip 11 which emits electromagnetic radiation of a first wavelength range, presently blue light, from a radiation exit surface. A conversion element 10 is applied to the radiation exit surface, as has already been described, for example, with reference to FIGS. 4, 7, 8 and 13. The conversion element 10 converts electromagnetic radiation of the first wavelength range into electromagnetic radiation of at least a second wavelength range.

The invention is not limited to the exemplary embodiments by the description thereof. Rather, the invention encompasses any new feature as well as any combination of features, which particularly includes any combination of features in the claims, even if that feature or combination itself is not explicitly specified in the claims or exemplary embodiments.

The present application claims priority to German application DE 102018128753.4, the disclosure content of which is hereby incorporated by reference.

LIST OF REFERENCE SIGNS 1, 1' conversion layer
2, 2' phosphor particles
3 matrix
4, 4' enrichment zone
5, 5' depletion zone
6, 6' compensation layer
7, 7' compensation particles
8 scattering layer
9 symmetry plane
10 conversion element
11 semiconductor chip

The invention claimed is:

1. Method for producing a conversion element comprising the following steps:
providing a conversion layer comprising a matrix in which phosphor particles are brought in, which convert electromagnetic radiation of a first wavelength range into electromagnetic radiation of a second wavelength range, wherein the phosphor particles comprise a host lattice with activator ions and are enriched in an enrichment zone at a first main surface of the conversion layer,
providing a compensation layer comprising the matrix, in which compensation particles are brought in, which transmit electromagnetic radiation of the first wavelength range and comprise the host lattice of the phosphor particles and are enriched in an enrichment zone at a first main surface of the compensation layer, and
connecting the conversion layer and the compensation layer so that the enrichment zone of the conversion layer and the enrichment zone of the compensation layer are arranged symmetrically with respect to each other with respect to a symmetry plane of the conversion element;
wherein the phosphor particles comprise a higher concentration in the enrichment zone than at a second main surface of the conversion layer opposite to the first main surface and that the compensation particles comprise a higher concentration in the enrichment zone than at a second main surface of the compensation layer opposite to the first main surface.

2. Method according to claim 1,
wherein providing the conversion layer comprises the following steps:
providing a liquid conversion material comprising the matrix and the phosphor particles,
forming a layer from the liquid conversion material,
sedimenting the phosphor particles in the matrix so that phosphor particles enrich in the enrichment zone at a first main surface of the layer of the liquid conversion material,
pre-curing and/or curing of the matrix, so that the conversion layer with the first main surface is formed, at which the phosphor particles are enriched in the enrichment zone.

3. Method according to claim 1,
wherein providing the compensation layer comprises the following steps:
providing a liquid compensation material comprising the matrix and the compensation particles,
forming a layer of the liquid compensation material,
sedimenting the compensation particles in the matrix so that compensation particles enrich at a first main surface of the layer of the liquid compensation material in an enrichment zone,
pre-curing and/or curing the matrix so that a compensation layer with the first main surface is formed, at which the compensation particles are enriched in the enrichment zone.

4. Method according to claim 3,
wherein the concentration of the phosphor particles and the concentration of the compensation particles in the matrix are respectively equal.

5. Method according to claim 1,
wherein the phosphor particles and the compensation particles comprise the same size distribution.

6. Method according to claim 1,
in which a scattering layer is arranged between the conversion layer and the compensation layer.

7. Conversion element having:
a conversion layer comprising a matrix in which phosphor particles are brought in, which convert electromagnetic radiation of a first wavelength range into electromagnetic radiation of a second wavelength range, wherein the phosphor particles comprise a host lattice with activator ions and are enriched in an enrichment zone at a first main surface of the conversion layer such that the phosphor particles comprise a higher concentration in the enrichment zone than at a second main surface of the conversion opposite to the first main surface, and
a compensation layer comprising a matrix in which compensation particles are brought in, which transmit electromagnetic radiation of the first wavelength range and comprise the host lattice of the phosphor particles and are enriched in an enrichment zone at a first main surface of the compensation layer such that the compensation particles comprise a higher concentration in the enrichment zone than at a second main surface of the compensation layer opposite to the first main surface, wherein
the enrichment zone of the conversion layer and the enrichment zone of the compensation layer are arranged symmetrically with respect to each other with respect to asymmetry plane of the conversion element.

8. Conversion element according to claim 7,
which comprises a plurality of compensation layers each having an enrichment zone, wherein the enrichment zones of the compensation layers and conversion layer are arranged symmetrically with respect to each other with respect to the symmetry plane of the conversion element.

9. Conversion element according to claim 7,
which comprises further conversion layers each with an enrichment zone, wherein the conversion element comprises a further compensation layer with an enrichment zone for each further conversion layer, and the enrichment zones of the further conversion layers and the enrichment zones of the further compensation layers are arranged symmetrically with respect to each other with respect to the symmetry plane of the conversion element.

10. Radiation-emitting component having:

radiation-emitting semiconductor chip which emits electromagnetic radiation of a first wavelength range from a radiation exit surface, and a conversion element according to claim 7 that at least partially converts electromagnetic radiation of the first wavelength range into electromagnetic radiation of a second wavelength range.

* * * * *